(12) United States Patent
Kuramochi

(10) Patent No.: US 6,634,564 B2
(45) Date of Patent: Oct. 21, 2003

(54) CONTACT/NONCONTACT TYPE DATA CARRIER MODULE

(75) Inventor: Satoru Kuramochi, Shinjuku-Ku (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 09/983,223

(22) Filed: Oct. 23, 2001

(65) Prior Publication Data

US 2002/0162894 A1 Nov. 7, 2002

(30) Foreign Application Priority Data

Oct. 24, 2000 (JP) ........................................ 2000-323437

(51) Int. Cl.[7] ............................................... G06K 19/06
(52) U.S. Cl. ........................ 235/492; 235/441; 235/449
(58) Field of Search ................................ 235/441, 449, 235/486, 487, 492, 493; 343/700, 866, 873, 895; 340/539; 399/12, 13

(56) References Cited

U.S. PATENT DOCUMENTS 5,598,032 A * 1/1997 Fidalgo ........................ 257/679
6,213,403 B1 * 4/2001 Bates, III .................... 235/492
6,353,420 B1 * 3/2002 Chung ......................... 343/895
6,378,774 B1 * 4/2002 Emori et al. ................ 235/492
6,385,407 B1 * 5/2002 Inose .......................... 399/24

FOREIGN PATENT DOCUMENTS

JP 8-87655 4/1996

* cited by examiner

Primary Examiner—Karl D. Frech
Assistant Examiner—Edwyn Labaze
(74) Attorney, Agent, or Firm—Parkhurst & Wendel, L.L.P.

(57) ABSTRACT

A contact/noncontact data carrier module applicable to a wide variety of purposes, and capable of satisfactorily meeting conditions on security. The contact/noncontact data carrier module includes a base member; a semiconductor chip mounted on the base member; a coil connected to the semiconductor chip adapted to be electromagnetically coupled with an external booster antenna for noncontact communication; and contact terminals connected to the semiconductor chip for contact with external contacts.

39 Claims, 3 Drawing Sheets

CONTACT/NONCONTACT TYPE DATA CARRIER MODULE

BACKGROUND OF THE INVENTION

1. Field of the Invention

The present invention relates to a data carrier module to be incorporated into an IC card or the like and, more particularly, to a contact/noncontact type data carrier module capable of exchanging information with an external reader-writer in either a contact information transfer mode or a noncontact information transfer mode.

2. Description of the Related Art

IC cards have gradually become prevalently used owing to their capability of keeping information confidential. Recently, there have been proposed noncontact type IC cards capable of exchanging information with an external reader-writer in a noncontact information transfer mode.

Generally, the noncontact type IC card uses electromagnetic waves to achieve signal exchange with an external reader-writer or to achieve both signal exchange with an external reader-writer and power supply from an external reader-writer. The noncontact type IC card and the reader-writer are provided with built-in antennas, respectively, to transmit and receive electromagnetic waves. The noncontact type IC card converts the electromagnetic waves received from the reader-writer into operating power through electromagnetic induction and exchanges signals with the reader-writer by means of electromagnetic waves.

Since such a noncontact type IC card does not need any contacts to be brought into contact with those of the reader-writer, it prevents any chance of causing contact failure. In addition, such a noncontact type IC card is capable of interacting with the reader-writer at a position spaced a distance in the range of several centimeters to several tens centimeters, and is resistant to soiling, rain and static electricity. Thus, demand for such noncontact type IC cards is expected to increase further in the future.

Various sheet- or label-shaped noncontact IC tags formed by connecting an IC chip (semiconductor chip) storing data, to an antenna coil have been proposed in recent years. Noncontact IC tags have been attached to commercial articles and packages in recent years to prevent shoplifting and to improve physical distribution management systems.

Recently, a test coil-on-chip semiconductor chip module has been proposed. The coil-on-chip semiconductor chip module is an IC chip provided with an antenna and serving as a data carrier that stores data. Studies of a noncontact type IC card or IC tag employing the test coil-on-chip semiconductor chip module are in progress.

Usually, the noncontact type data carrier device, such as the noncontact type IC card or IC tag, is provided with a data carrier module, such as a coil-on-chip semiconductor chip including a booster antenna coil, i.e., a primary coil, for signal exchange with an external device, and a secondary coil electromagnetically coupled with the booster antenna coil. In this specification, the term "data carrier module" is used as a general designation of modules having a minute coil serving as a secondary coil and formed by connecting the minute coil to a data carrier, such as a semiconductor chip.

The booster antenna coil, i.e., the primary coil, and the secondary coil of the data carrier module are not connected and are located properly relative to each other. More specifically, a coil-building part is formed in the booster antenna coil (the primary coil) and the data carrier module is mounted on the noncontact type data carrier device so that the secondary coil is superposed on the coil-building part of the booster antenna coil (the primary coil). The coil-building part of the booster antenna coil (the primary coil) and the secondary coil of the data carrier module are formed in substantially the same shape to enhance the efficiency of electromagnetic coupling.

Terminal devices, such as portable telephones for the PHS (the personal handyphone system), wireless portable telephones, such as mobile telephones, and hand-held computers, have rapidly come into wide use in recent years and many persons carry such terminal devices. Various attempts have been made to add various additional values to portable telephones or the like.

For instance, JP-A 87655/1996 discloses an information processing system, in which, when an IC card bearer, i.e., a portable telephone possessor, purchases an article or demands for a pay service by inserting the IC card in a portable telephone, an article providing apparatus obtains information recorded on the IC card through the portable telephone and makes electrical settlement of transactions automatically by using the information read from the IC card. Generally, the IC card to be used by this information processing system is a contact type IC card, and the portable telephone is provided with a contact type reader-writer provided with electrical contacts.

Although noncontact type IC cards have been widely diffused, contact type IC cards provided with electrical contacts are used prevalently for practical purposes, because contact type IC cards are superior to noncontact type IC cards in security when IC cards are used as electronic settlement cards for electric commerce and identification cards which must be reliable in security. Generally, contact type IC cards operate stably because those cards are connected electrically to the reader-writer through the contacts.

The noncontact type IC card as mentioned above is formed by embedding a data carrier module (noncontact type IC module), such as a coil-on-chip semiconductor chip, in a card-shaped medium. Uses of such noncontact type IC mediums provided with a data carrier module are not limited to conventional uses, and such noncontact type IC mediums are expected to be used generally not only in specific fields, but also in various fields in which information transmission is necessary.

SUMMARY OF THE INVENTION

The present invention has been made in view of the foregoing circumstances and it is therefore an object of the present invention to provide a contact/noncontact type data carrier module applicable to a wide variety of purposes, and capable of satisfactorily meeting conditions on security.

According to the present invention, a contact/noncontact type data carrier module includes a base member; a semiconductor chip mounted on the base member; a coil connected to the semiconductor chip and adapted to be electromagnetically coupled with an external booster antenna for noncontact communication; and a contact terminal connected to the semiconductor chip and adapted to be brought into contact with an external contact.

In the contact/noncontact type data carrier module according to a first aspect of the present invention, it is preferable that the semiconductor chip is disposed on a first major surface of the base member such that its terminal surface provided with terminals faces out; the contact terminal is formed on a second major surface on the opposite side of the first major surface of the base member; and the semiconductor chip and the contact terminal are connected through a contact terminal connecting hole formed in the base member by a contact terminal connecting part. Preferably, the contact terminal connecting part includes a bonding wire connecting a terminal of the semiconductor chip and the contact terminal. Preferably, the contact terminal connecting part includes a connecting wiring part formed on the first major surface of the base member, a bonding wire connecting a terminal of the semiconductor chip and the connecting wiring part, and a via part formed in the contact terminal connecting hole of the base member and connecting the connecting wiring part and the contact terminal.

In the contact/noncontact type data carrier module according to the first aspect of the present invention, it is preferable that the coil is formed on the terminal surface of the semiconductor chip; and the coil and the semiconductor chip are connected by a coil connecting part. Preferably, the coil connecting part includes a bonding wire connecting a terminal of the semiconductor chip and a terminal of the coil.

In the contact/noncontact type data carrier module according to the first aspect of the present invention, it is preferable that the coil is formed on the first major surface of the base member; and the semiconductor chip and the coil are connected by a coil connecting part. Preferably, the coil connecting part includes a bonding wire connecting a terminal of the semiconductor chip and a terminal of the coil. Preferably, the coil is disposed near the semiconductor chip on the first major surface of the base member.

According to a second aspect of the present invention, it is preferable that the semiconductor chip is disposed on a first major surface of the base member such that its terminal surface provided with terminals faces the base member; the contact terminal is formed on a second major surface on the opposite side of the first major surface of the base member; and the semiconductor chip and the contact terminal are connected through a contact terminal connecting hole formed in the base member by a contact terminal connecting part. Preferably, the contact terminal connecting part includes a connecting wiring part formed on the first major surface of the base member, and a via part formed in the contact terminal connecting hole and connecting the connecting wiring part and the contact terminal; and a terminal of the semiconductor chip is connected to the connecting wiring part by flip-chip solder bonding.

In the contact/noncontact type data carrier module according to the second aspect of the present invention, it is preferable that the coil is formed on the terminal surface of the semiconductor chip; and the coil and the semiconductor chip are connected by a coil connecting part. Preferably, the coil is formed on an insulting layer covering a wiring layer formed on the terminal surface of the semiconductor chip; the wiring layer is connected to a terminal of the semiconductor chip; and the coil connecting part includes the wiring layer, and a via part formed in the insulating layer and connecting the wiring layer and the terminal of the coil.

In the contact/noncontact type data carrier module according to the second aspect of the present invention, it is preferable that the coil is formed on the first major surface of the base member; and the semiconductor chip and the coil are connected by a coil connecting part through a pair of coil connecting holes formed in the base member. Preferably, the coil connecting part includes a connecting wiring part formed on the second major surface of the base member, a connecting terminal formed on the first major surface of the base member, and a pair of via parts respectively formed in the pair of coil connecting holes of the base member and respectively connecting one terminal of the coil and the connecting wiring part, and the connecting wiring part and the connecting terminal; and terminals of the semiconductor chip are connected to the connecting terminal, connected to one terminal of the coil, and the other terminal of the coil by flip-chip solder bonding.

According to the present invention, it is preferable that the contact/noncontact type data carrier module further includes a sealing resin layer sealing the semiconductor chip, the coil and the wiring part therein.

Preferably, the contact/noncontact type data carrier module according to the present invention is used as a SIM (scriber identity module) for use in combination with a booster card or a portable telephone.

Preferably, the semiconductor chip of the contact/noncontact type data carrier module according to the present invention is provided with a user authentication circuit for authenticating the user, and a noncontact type communication circuit for downloading various pieces of information through the Internet by using a communication device adapted to be connected to the Internet.

The contact/noncontact type data carrier module according to the present invention is capable of communicating with an external device, provided with a booster antenna coil, or an external medium in a noncontact communication mode and is capable of exchanging signals by connecting the contact terminals with the contacts of an external device or an external medium. Thus, the contact/noncontact type data carrier module can be used for a wide variety of purposes, and is capable of satisfactorily meeting conditions on security.

DESCRIPTION OF THE PREFERRED EMBODIMENTS

First Embodiment

A contact/noncontact type data carrier module in a first embodiment of the present invention will be described with reference to FIG. 1.

Figure 1:
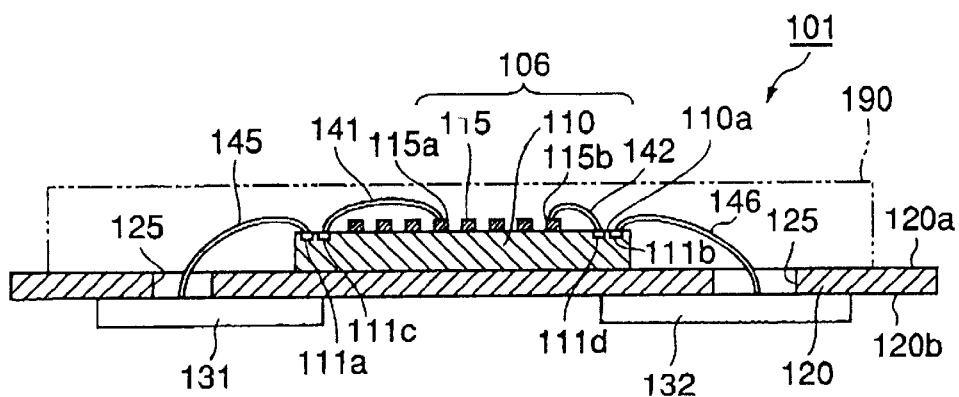
FIG. 1 is a schematic sectional view of a contact/noncontact type data carrier module in a first embodiment of the present invention.

Referring to FIG. 1, a contact/noncontact type data carrier module 101 in a first embodiment of the present invention has a base member 120 and a semiconductor chip 101 mounted on a first major surface 120a of the base member 120. The semiconductor chip 110 is disposed on the first major surface 120a of the base member 120 such that its terminal surface 110a provided with terminals 111a, 111b, 111c and 111d faces out. A coil 115 is formed on the terminal surface 110a of the semiconductor chip 110. The semiconductor chip 110 and the coil 115 constitute a coil-on-chip semiconductor chip module 106.

Contact terminals 131 and 132 are formed on a second major surface 120b of the base member 120 on the opposite side of the first major surface 120a.

The semiconductor chip 110 and the contact terminals 131 and 122 are interconnected by connecting the terminals 111a and 111b of the semiconductor chip 110 and the contact terminals 131 and 132 with bonding wires (contact terminal connecting parts) 145 and 146. The base member 120 is provided with holes (contact terminal connecting holes) 125. The bonding wires 145 and 146 are extended from the terminals 111a and 111b of the semiconductor chip 110 through the holes 125 to the contact terminals 131 and 132 on the base member 120, respectively.

The semiconductor chip 110 and the coil 115 are interconnected by connecting the terminals 111c and 111d of the semiconductor chip 110 and terminals 115a and 115b of the coil 115 with bonding wires (coil connecting parts) 141 and 142, respectively.

The semiconductor chip 110 exchanges data with an external reader-writer, not shown, through the coil 115 electrically connected thereto. The semiconductor chip 110 is provided with a control circuit, a storage device, a receiving circuit and a transmitting circuit.

The coil 115 is a secondary coil to be electromagnetically coupled with the booster antenna coil (primary coil) of an external device or an external medium for noncontact communication. Generally, the coil 115 is a densely coiled coil formed by densely coiling a fine line. The coil 115 is electromagnetically exposed so as to be able to exchange electromagnetic waves with the booster antenna coil, i.e., the primary coil, and forms a resonance circuit together with the primary coil.

The alignment of the booster antenna coil, i.e., the primary coil, and the secondary coil will be described with reference to FIG. 6A. A booster antenna coil 621 included in a booster card 620, i.e., an external medium, has a densely coiled part 650. A data carrier module 610 is placed on the booster card 620 such that a coil 611, which corresponds to the coil 115 in FIG. 1, overlies the densely coiled part 650.

Although the width of the line forming the coil 115 and density of loops forming the coil 115 do not necessarily coincide with those of the booster antenna coil, highly efficient electromagnetic coupling of the coil 115 and the booster antenna coil can be achieved when the respective widths of the lines forming the coil 115 and the booster antenna coil and the respective densities of the loops forming the coil 115 and the booster antenna coil are as equal to each other as possible.

There have bee proposed various coil-on-chip semiconductor chip modules formed by processing a wafer and dicing the wafer, and similar to the coil-on-chip semiconductor chip module 106 including the semiconductor chip 110 and the coil 115. In view of conductivity and cost, a copper layer, or a laminated layer consisting of a copper layer, as a primary layer, and a nickel layer (Ni layer) or a gold layer (Au layer) may be used for forming the coil 115.

The base member 120 holding the semiconductor chip 110 and the contact terminals 131 and 132 thereon may be formed of an electromagnetic-wave-transmitting insulating material generally used as a material for forming communication devices. Such an insulating material is an epoxy resin, a polyimide resin, a fluorocarbon resin or the like.

The contact terminals 131 and 132 electrically connected to the semiconductor chip 110 are connected to the contacts of an external device or an external medium. Preferably, the morphology of the contact terminals 131 and 132 is basically the same as that of contact terminals generally used by IC cards or the like. A copper layer, or a copper layer coated with a nickel layer (Ni layer) or a gold layer (Au layer) may be used for forming the contact terminals 131 and 132.

A method of fabricating the contact/noncontact type data carrier module 101 will be described.

First, the coil-on-chip semiconductor chip module 106 including the semiconductor chip 110 and the coil 115 is fabricated.

The semiconductor chip 110 is formed by processing a wafer. A conductive layer for electroplating is formed over the entire terminal surface 110a of the semiconductor chip 110. Then, a photosensitive insulating layer is formed over the conductive layer. Subsequently, the photosensitive insulating layer is exposed to light to form a plating resist layer having an opening of a shape corresponding to the coil 115. A coil-forming layer (the coil 115) is deposited on parts of the conductive layer exposed through the opening formed in the plating resist layer by an electroplating process, and then the plating resist layer is removed. Then, the conductive layer exposed after the removal of the plating resist layer is removed by a soft etching process so that the coil-forming layer may not be damaged. Thus, the coil-forming layer (the coil 115) is formed on the terminal surface 110a of the semiconductor chip 110. The wafer is diced into semiconductor chips 110 to provide coil-on-chip semiconductor chip modules 106 each provided with the coil 115 on its terminal surface 110a.

The holes 125 are formed in the base member 120, and the coil-on-chip semiconductor chip module 106 is attached to the first major surface 120a of the base member 120 with, when necessary, an adhesive layer, not shown.

The terminals 131 and 132 are attached to the second major surface 120b of the base member 120 by crimping or with, when necessary, an adhesive layer, not shown.

Then, the terminals 111a and 111b of the semiconductor chip 110 are connected through the holes 125 to the contact terminals 131 and 132 with the bonding wires 145 and 146 by wire bonding, and the terminals 111c and 111d of the semiconductor chip 110 are connected to the terminals 115a and 115b of the coil 115 with the bonding wires 141 and 142, respectively. Thus, the contact/noncontact type data carrier module 101 shown in FIG. 1 is completed.

In the first embodiment, a sealing resin layer 190 may be formed over the coil-on-chip semiconductor chip module 106 of the contact/noncontact type data carrier module 101 so as to cover the semiconductor chip 110, the coil 115 and the bonding wires 141, 142, 145 and 146.

Second Embodiment

A contact/noncontact type data carrier module in a second embodiment of the present invention will be described with reference to FIG. 2, in which parts like or corresponding to those of the contact/noncontact type data carrier module in the first embodiment shown in FIG. 1 are denoted by the same reference numerals and the description thereof will be omitted. The contact/noncontact type data carrier module in the second embodiment is substantially the same as the contact/noncontact type data carrier module in the first embodiment, except that terminals of a semiconductor chip and contact terminals of the contact/noncontact type data carrier module in the second embodiment are connected by a connecting method different from that of connecting those of the contact/noncontact type data carrier module in the first embodiment.

Figure 2:
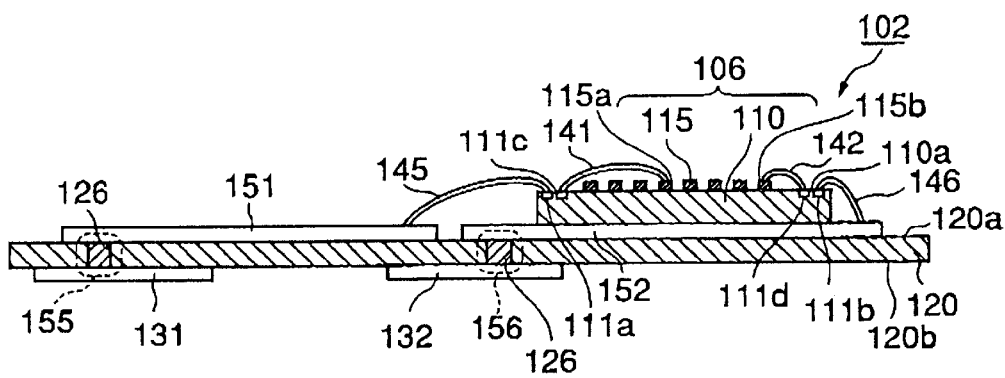
FIG. 2 is a schematic sectional view of a contact/noncontact type data carrier module in a second embodiment of the present invention.

Referring to FIG. 2, a contact/noncontact type data carrier module 102 in a second embodiment of the present invention has a base member 120 provided with connecting wiring parts 151 and 152 formed on a first major surface 120a thereof. A semiconductor chip 110 is disposed on the connecting wiring part 152. Contact terminals 131 and 132 are formed on a second major surface 120b of the base member 120.

The base member 120 is provided with holes (contact terminal connecting holes) 126. Via parts (contact parts) 155 and 156 are formed in the holes 126 so as to connect the connecting wiring parts 151 and 152 to the contact terminals 131 and 132, respectively. Terminals 111a and 111b of the semiconductor chip 110 are connected to the connecting wiring parts 151 and 152 with bonding wires 145 and 146, respectively. Thus, the semiconductor chip 110 is connected electrically to the contact terminals 131 and 132 by connecting the terminals 111a and 111b of the semiconductor chip 110 to the contact terminals 131 and 132 through the bonding wires 145 and 146, the connecting wiring parts 151 and 152 and the via parts 155 and 156. The bonding wires 145 and 146, the connecting wiring parts 151 and 152 and the via parts 155 and 156 constitute contact terminal connecting parts.

A method of fabricating this contact/noncontact type data carrier module 102 will be described hereinafter.

First, the coil-on-chip semiconductor chip module 106 including the semiconductor chip 110 and the coil 115 formed on the terminal surface 110a of the semiconductor chip 110 is fabricated by the same method as that by which the first embodiment is fabricated.

A copper-clad laminated plate having opposite surfaces coated with copper is prepared as the base member 120. The connecting wiring parts 151 and 152, and the contact terminals 131 and 132 are formed on the first major surface 120a and the second major surface 120b, respectively, of the base member 120 by a photolithographic etching process. The holes 126 are formed in the base member 120 before or after the photolithographic etching process.

A conductive material is deposited in the holes 126 of the base member 120 by an electroless plating process and an electroplating process to form the via parts 155 and 156. Then, the coil-on-chip semiconductor chip module 106 is placed on the connecting wiring part 152 formed on the first major surface 120a of the base member 120. When necessary, it is preferable to coat the surfaces of the contact terminals 131 and 132 with gold (Au) or the like by a plating process before the electroless plating process or the electroplating process.

Subsequently, the terminals 111a and 111b of the semiconductor chip 110 are connected to the connecting wiring parts 151 and 152 with bonding wires 145 and 146, respectively by wire bonding, and the terminals 111c and 111d of the semiconductor chip 110 are connected to the terminals 115a and 115b of the coil 115 with bonding wires 141 and 142, respectively. Thus, the contact/noncontact type data carrier module 102 shown in FIG. 2 is completed.

The contact/noncontact type data carrier module 102 may be fabricated by the following method instead of by the foregoing method.

After the holes 126 are formed in the base member 120, plating resist layers are formed on the major surfaces 120a and 120b of the base member 120 by photolithography. Then, after the major surfaces 120a and 120b of the base member 120 and the holes 126 are activated, the base member 120 is subjected to an electroless plating process. Then, the connecting wiring parts 151 and 152, the contact terminals 131 and 132 and the via parts 155 and 156 are formed by an electroplating process.

Subsequently, the base member 120 is processed by a soft etching process, and then the coil-on-chip semiconductor chip module 106 is placed on the connecting wiring part 152 formed on the first major surface 120a of the base member 120. When necessary, it is preferable to coat the surfaces of the contact terminals 131 and 132 with gold (Au) or the like by a plating process before the soft etching process.

Then, the terminals 111a and 111b of the semiconductor chip 110 are connected to the connecting wiring parts 151 and 152 with the bonding wires 145 and 146, respectively, by wire bonding, and the terminals 111c and 111d of the semiconductor chip 110 are connected to the terminals 115a and 115b of the coil 115 with the bonding wires 141 and 142, respectively. Thus, the contact/noncontact type data carrier module 102 shown in FIG. 2 is completed.

In the second embodiment, a sealing resin layer may be formed, similarly to the sealing resin layer 190 of the first embodiment, over the coil-on-chip semiconductor chip module 106 of the contact/noncontact type data carrier module 102 so as to cover the semiconductor chip 110, the coil 115, the bonding wires 141, 142, 145 and 146, and the connecting wiring parts 151 and 152.

Third Embodiment

A contact/noncontact type data carrier module in a third embodiment of the present invention will be described with reference to FIG. 3, in which parts like or corresponding to those of the contact/noncontact type data carrier module in the first embodiment shown in FIG. 1 are denoted by the same reference numerals and the description thereof will be omitted. The contact/noncontact type data carrier module in the third embodiment is substantially the same as the contact/noncontact type data carrier module in the first embodiment, except that the arrangement of a coil in the third embodiment is different from that in the first embodiment.

Figure 3:
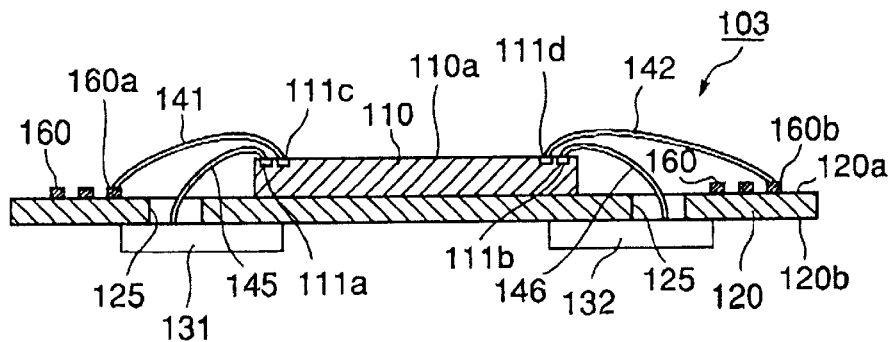
FIG. 3 is a schematic sectional view of a contact/noncontact type data carrier module in a third embodiment of the present invention.

Referring to FIG. 3, in a contact/noncontact type data carrier module 103 in a third embodiment of the present invention, a coil 160, i.e., a secondary coil, is formed on a first major surface 120a of a base member 120 instead of on a terminal surface 110a of a semiconductor chip 110. Terminals 111c and 111d included in the semiconductor chip 110 are connected to the terminals 160a and 160b of the coil 160 with bonding wires (coil connecting parts) 141 and 142, respectively. The coil 160 is disposed around the semiconductor chip 110 on the first major surface 120a of the base member 120 as shown in FIG. 3.

A method of fabricating this contact/noncontact type data carrier module 103 will be described hereinafter.

A copper-clad laminated plate having a surface corresponding to the first major surface 120a and coated with a copper layer is prepared as the base member 120. The copper layer coating the first major surface 120a is subjected to a photolithographic etching process to form the coil 160 on the first major surface 120a. Holes 125 are formed in the base member 120 before or after the photolithographic etching process.

Then, a semiconductor chip 110 is disposed on the first major surface 120a of the base member 120. When necessary, the semiconductor chip 110 is bonded to the first major surface 120a with an adhesive layer, not shown.

Terminals 131 and 132 are attached to a second major surface 120b of the base member 120 by crimping or with, when necessary, an adhesive layer, not shown.

Then, terminals 111a and 111b included in the semiconductor chip 110 are connected through the holes 125 to the contact terminals 131 and 132 with bonding wires 145 and 146 by wire bonding, and terminals 111c and 111d included in the semiconductor chip 110 are connected to the terminals 160a and 160b of the coil 160 with bonding wires 141 and 142, respectively. Thus, the contact/noncontact type data carrier module 103 shown in FIG. 3 is completed.

In the third embodiment, a sealing resin layer may be formed, similarly to the sealing resin layer 190 of the first embodiment, over the semiconductor chip 110 of the contact/noncontact type data carrier module 103 so as to cover the semiconductor chip 110, the coil 160, and the bonding wires 141, 142, 145 and 146.

Fourth Embodiment

A contact/noncontact type data carrier module in a fourth embodiment of the present invention will be described with reference to FIG. 4, in which parts like or corresponding to those of the contact/noncontact type data carrier module in the first embodiment shown in FIG. 1 are denoted by the same reference numerals and the description thereof will be omitted. The contact/noncontact type data carrier module in the fourth embodiment is substantially the same as the contact/noncontact type data carrier module in the first embodiment, except that the arrangement of a semiconductor chip, a method of connecting the terminals of a semiconductor chip and contact terminals, and a method of connecting the terminals of the semiconductor chip and a coil in the fourth embodiment are different from those in the first embodiment.

Figure 4A:
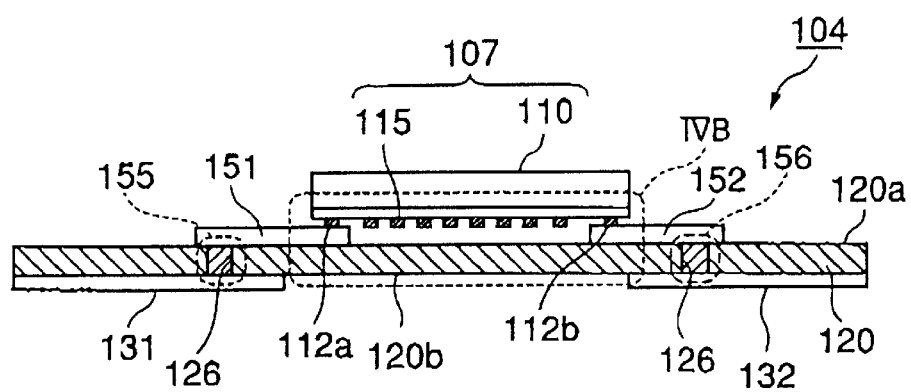
FIG. 4A is a schematic sectional view of a contact/noncontact type data carrier module in a fourth embodiment of the present invention.
Figure 4B:
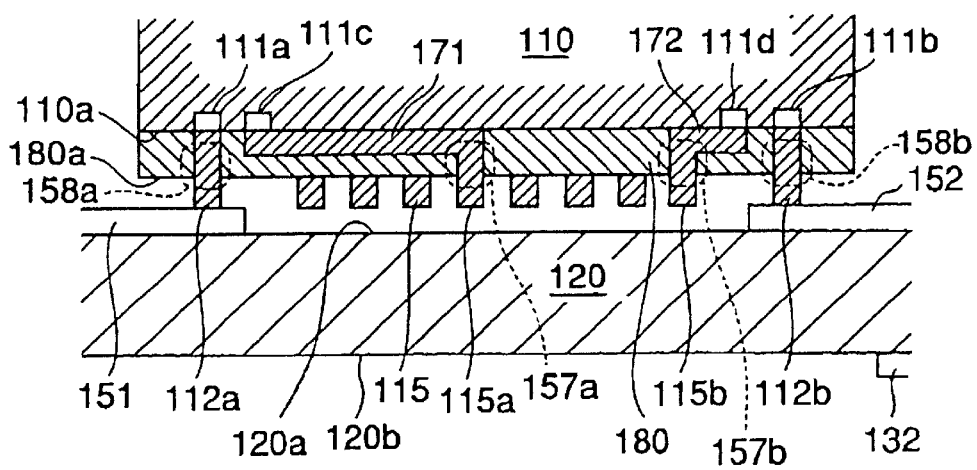
FIG. 4B is an enlarged view of a part IVB in FIG. 4A.

Referring to FIGS. 4A and 4B showing a contact/noncontact type data carrier module 104 in a fourth embodiment of the present invention, a semiconductor chip 110 is disposed on a first major surface 120a of a base member 120 such that its terminal surface 110a provided with terminals 111a, 111b, 111c and 111d faces the base member 120.

As shown in FIG. 4B, wiring layers 171 and 172 are formed on the terminal surface 110a of the semiconductor chip 110 and are connected to the terminals 111c and 111d of the semiconductor chip 110, respectively. The wiring layers 171 and 172 are covered with an insulating layer 180. A coil 115 is formed on the surface 180a of the insulting layer 180. The semiconductor chip 110 and the coil 115 constitute a coil-on-chip semiconductor chip module 107.

Via parts 157a and 157b are formed in the insulating layer 180 to connect the wiring layers 171 and 172 to the terminals 115a and 115b of the coil 115, respectively. Thus, the semiconductor chip 110 and the coil 115 are interconnected through the wiring layers 171 and 172 and the via parts 157a and 157b. The wiring layers 171 and 172 and the via parts 157a and 157b constitute coil connecting parts.

Via parts 158a and 158b are formed in the insulating layer 180. The terminals 111a and 111b of the semiconductor chip 110 are connected through the via parts 158a and 158b to protruding terminals 112a and 112b formed on the surface 180a of the insulating layer 180, respectively.

As shown in FIG. 4A, connecting wiring parts 151 and 152 are formed on the first major surface 120a of the base member 120.

Holes (contact terminal connecting holes) 126 are formed in the base member 120. Via parts 155 and 156 are formed in the holes 126 to connect the connecting wiring parts 151 and 152 to contact terminals 131 and 132, respectively. The protruding terminals 112a and 112b connected to the terminals 111a and 111b of the semiconductor chip 110 are connected to the connecting wiring parts 151 and 152 by flip-chip solder bonding. Thus, the semiconductor chip 110 and the contact terminals 131 and 132 are interconnected through the via parts 158a and 158b, the protruding terminals 112a and 112b, the connecting wiring parts 151 and 152 and the via parts 155 and 156. The via parts 158a and 158b, the protruding terminals 112a and 112b, the connecting wiring parts 151 and 152 and the via parts 155 and 156 constitute contact terminal connecting parts.

A method of fabricating the contact/noncontact type data carrier module 104 will be described hereinafter.

The coil-on-chip semiconductor chip module 107 including the semiconductor chip 110 and the coil 115 is fabricated.

A wafer is processed to form semiconductor chips 110. A conductive layer for electroplating is formed over the terminal surfaces 110a of the semiconductor chips 110, and a photosensitive insulating layer is formed over the conductive layer. The photosensitive insulating layer is exposed to light and a plating resist layer having openings of shapes corresponding to those of the wiring layers 171 and 172 is formed by photolithography. Conductive layers are deposited on parts of the conductive layer exposed in the openings of the plating resist layer by an electroplating process to form the wiring layers 171 and 172 on the conductive layer, and then the plating resist layer is removed. Then, remaining parts of the conductive layer exposed after the removal of the plating resist layer are removed by a soft etching process so that the wiring layers 171 and 172 may not be damaged. Thus, the wiring layers 171 and 172 are formed on the terminal surfaces 110a of the semiconductor chips 110.

A photosensitive polyimide resin film is formed over the entire terminal surfaces 110a of the semiconductor chips 110, openings are formed in parts corresponding to the via parts 157 and 158 are formed in the photosensitive polyimide resin film by photolithography, and the photosensitive polyimide resin film including the openings is activated, and a conductive layer is formed on the photosensitive polyimide resin film by an electroless plating process.

Then, a photosensitive insulating layer is formed over the entire conductive layer, and a plating resist layer having openings of shapes corresponding to those of the coils 115, via parts 157a and 157b, via parts 158a and 158b and the protruding terminals 112a and 112b is formed by processing the photosensitive insulating layer by photolithography. Then, the coils 115, via parts 157a and 157b, via parts 158a and 158b and the protruding terminals 112a and 112b are formed by subjecting parts of the conductive layer exposed in the openings of the plating resist layer to an electroplating process. Then, the plating resist layer is removed. Parts of the conductive layer exposed after the plating resist layer has been removed is removed by a soft etching process so that the coils 115, the via parts 157a and 157b, the via parts 158a and 158b and the protruding terminals 112a and 112b may not be damaged.

The wafer is divided into individual semiconductor chips 110 by dicing to provide coil-on-chip semiconductor chip modules 107 each having the coil 115 formed on the surface 180a of the insulating layer 180.

A copper-clad laminated plate having surfaces corresponding to the major surfaces 120a and 120b and coated respectively with copper layers is prepared as the base member 120. The copper layers coating the first major surfaces 120a and 120b are subjected to a photolithographic etching process to form the connecting wiring parts 151 and 152 on the first major surface 120a and to form the contact terminals 131 and 132 on the second major surface 120b. Holes 126 are formed in the base member 120 before or after the photolithographic etching process.

Then, the via parts 155 and 156 are formed in the holes 126 of the base member 120 by an electroless plating process and an electroplating process, and the protruding terminals 112a and 112b connected to the terminals 111a and 111b of the semiconductor chip 110 are connected to the connecting wiring parts 151 and 152 by flip-chip solder bonding. When necessary, parts of the connecting wiring parts 151 and 152 corresponding to the protruding terminals 112a and 112b may be provided with bumps. Thus, the contact/noncontact type data carrier module 104 shown in FIG. 4 is completed.

The contact/noncontact type data carrier module 104 may be fabricated by the following method instead of by the foregoing method.

After the holes 126 are formed in the base member 120, plating resist layers are formed on the major surfaces 120a and 120b of the base member 120 by photolithography. Then, after the major surfaces 120a and 120b of the base member 120 and the holes 126 are activated, the base member 120 is subjected to an electroless plating process. Then, the connecting wiring parts 151 and 152, the contact terminals 131 and 132 and the via parts 155 and 156 are formed by an electroplating process.

Subsequently, the base member 120 is processed by a soft etching process, and then the protruding terminals 112a and 112b connected to the terminals 111a and 111b of the semiconductor chip 110 are connected to the connecting wiring parts 151 and 152 by flip-chip solder bonding. When necessary, bumps may be formed in parts of the connecting wiring parts 151 and 152 corresponding to the protruding terminals 112a and 112b. Thus, the contact/noncontact data carrier module 104 is completed.

In the fourth embodiment, a sealing resin layer may be formed, similarly to the sealing resin layer 190 of the first embodiment, over the coil-on-chip semiconductor chip module 107 of the contact/noncontact type data carrier module 104 so as to cover the semiconductor chip 110, the coil 115, and the connecting wiring parts 151 and 152.

Fifth Embodiment

A contact/noncontact type data carrier module in a fifth embodiment of the present invention will be described with reference to FIG. 5, in which parts like or corresponding to those of the contact/noncontact type data carrier module in the fourth embodiment shown in FIGS. 4A and 4B are denoted by the same reference numerals and the description thereof will be omitted. The contact/noncontact type data carrier module in the fifth embodiment is substantially the same as the contact/noncontact type data carrier module in the fourth embodiment, except that the arrangement of a coil, and a method of connecting the terminals of a semiconductor chip and the coil in the fifth embodiment are different from those in the fourth embodiment.

Figure 5:
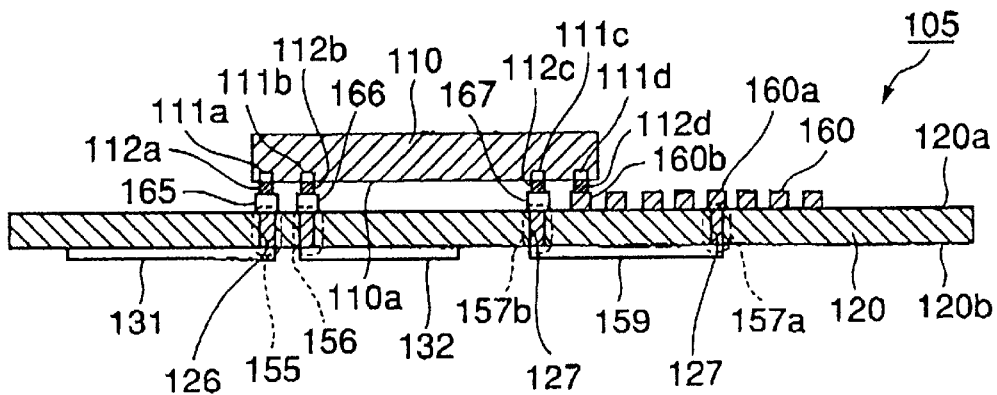
FIG. 5 is a schematic sectional view of a contact/noncontact type data carrier module in a fifth embodiment of the present invention.

Referring to FIG. 5, in a contact/noncontact type data carrier module 105 in a fifth embodiment of the present invention, a coil 160, i.e., a secondary coil, is formed on a first major surface 120a of a base member 120 instead of on the terminal surface 110a of a semiconductor chip 110.

Connecting terminals (rounds) 165, 166 and 167 to be connected to terminals 111a, 111b and 111c are formed on the first major surface 120a of the base member 120. Contact terminals 131 and 132 and a connecting wiring part 159 are formed on a second major surface 120b of the base member 120.

Holes (coil connecting holes) 127 are formed in the base member 120. A pair of via parts 157a and 157b for connecting a terminal 160a of the coil 160 and the connecting wiring part 159 and for connecting the connecting wiring part 159 and the connecting terminal 167 are formed in the holes 127. Protruding terminals 112c and 112d connected to the terminals 111c and 111d of the semiconductor chip 110 are connected to the connecting terminal 167, electrically connected to the terminal 160a of the coil 160, and the other terminal 160b of the coil 160, respectively, by flip-chip solder bonding. Thus, the semiconductor chip 110 and the coil 160 are electrically connected by connecting the terminal 111c of the semiconductor chip 110 and the terminal 160a of the coil 160 through the protruding terminal 112c connected to the terminal 111c of the semiconductor chip 110, the connecting terminal 167, the via part 157b, the connecting wiring part 159 and the via part 157a, and by connecting the terminal 111d of the semiconductor chip 110 and the other terminal 160b of the coil 160 through the protruding terminal 112d. The protruding terminals 112c and 112d, the connecting terminal 167, the via parts 157a and 157b and the connecting wiring part 159 constitute coil connecting parts.

The base member 120 is provided with holes (contact terminal connecting holes) 126. Via parts 155 and 156 are formed in the holes 126 to connect the connecting terminals 165 and 166 to the contact terminals 131 and 132, respectively. The protruding terminals 112a and 112b connected to the terminals 111a and 111b of the semiconductor chip 110 are connected to the connecting terminals 165 and 166, respectively, by flip-chip solder bonding. Thus, the semiconductor chip 110 is connected to the contact terminals 131 and 132 by connecting the terminals 111a and 111b of the semiconductor chip 110 to the contact terminals 131 and 132 through the connecting terminals 165 and 166 and the via parts 155 and 156. The connecting terminals 165 and 166 and the via parts 155 and 156 constitute contact terminal connecting parts.

A method of fabricating this contact/noncontact type data carrier module 105 will be described hereinafter.

A copper-clad laminated plate having surfaces corresponding to the major surfaces 120a and 120b and coated respectively with copper layers is prepared as the base member 120. The first major surface 120a is subjected to a photolithographic etching process to form the coil 160 and the connecting terminals 165, 166 and 167. The second major surface 120b is subjected to a photolithographic etching process to form the contact terminals 131 and 132 and the connecting wiring part 159. The holes 126 and 127 are formed in the base member 120 before or after processing the base member 120 by the photolithographic etching processes.

The via parts 155, 156, 157a and 157b are formed in the holes 126 and 127 of the base member 120 by an electroless plating process and an electroplating process. The protruding terminals 112a, 112b, 112c and 112d connected respectively to the terminals 111a, 111b, 111c and 111d of the semiconductor chip 110 are connected to the connecting terminals 165, 166 and 167 and the terminal 160b of the coil 160, respectively, by flip-chip solder bonding. Thus, the contact/noncontact data carrier module 105 shown in FIG. 5 is completed.

The contact/noncontact data carrier module 105 can be fabricated by methods other than the foregoing method.

Another method of fabricating the contact/noncontact data carrier module 105 includes the steps of forming the holes 126 and 127 in the base member 120, forming plating resist layers on the major surfaces 120a and 120b of the base member 120 by photolithography, activating the major surfaces 120a and 120b and the holes 126 and 127 of the base member 120, subjecting the base member 120 to electroless plating, and forming the coil 160, the connecting terminals 165, 166 and 167, the contact terminals 131 and 132, the connecting wiring part 159 and the via parts 155, 156, 157a and 157b by electroplating. Thus, the contact/noncontact data carrier module 105 is completed.

In the fifth embodiment, a sealing resin layer may be formed, similarly to the sealing resin layer 190 of the first embodiment, over the semiconductor chip 110 so as to cover the semiconductor chip 110, the coil 160, and the connecting terminals 165, 166 and 167.

Modes of Usage

Modes of usage of the contact/noncontact data carrier modules in the first to the fifth embodiment will be described with reference to FIGS. 6A to 6C.

Figure 6A:
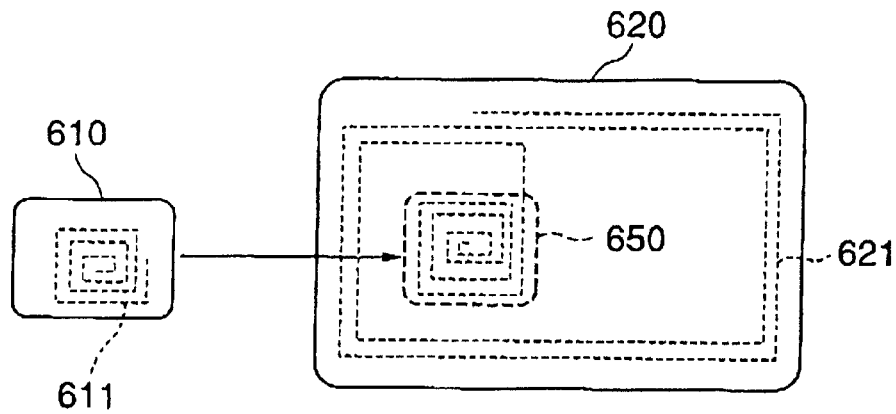
FIGS. 6A to 6C are schematic views of assistance in explaining modes of use of a contact/noncontact type data carrier module according to the present invention.

A data carrier module 610, which represents the contact/noncontact data carrier modules 101 to 105 shown in FIGS. 1 to 5, can be used as a SIM (scriber identity module) for a booster card or a SIM for a portable telephone as shown in FIG. 6A.

When using the data carrier module 610 having a coil (secondary coil) 611 as a SIM for a booster card 620 as shown in FIG. 6A, the data carrier module 610 is inserted in a slot 650 formed in the booster card 620.

The booster card 620 is provided with a booster antenna coil (primary coil) 621 having a densely coiled part formed in a part corresponding to the slot 650. The data carrier module 610 is inserted in the slot 650 so that the coil 611 overlies the densely coiled part of the booster antenna coil 621. The densely coiled part of the booster antenna coil 621 and the coil 611 of the data carrier module 610 are formed in substantially the same shape to enhance electromagnetic coupling efficiency.

When the data carrier module 610 is thus inserted in the slot of the booster card 620, an external reader-writer is able to access the semiconductor chip of the contact/noncontact type data carrier module 610 through the booster antenna coil 621 in a noncontact access mode.

The semiconductor chip of the data carrier module 610 has a controller, a storage device, a receiving circuit and a transmitting circuit. An input signal received by the coil 611 is transferred through the receiving circuit and the controller to the storage device. A signal provided by the storage device is transferred through the controller to the transmitting circuit, and then the transmitting circuit transmits the signal through the booster antenna coil 621 of the booster card 620 to the external reader-writer. The storage device of the semiconductor chip holds various pieces of information required of a data carrier.

A wave of 125 kHz (medium wave), 13.56 MHz or 2.45 GHz (microwave) is used for communication between the booster card 620 and the external reader-writer. Possible communication distance is on the order of 2 cm when a wave of 125 kHz is used and is on the order of 20 cm when a wave of 13.56 MHz is used. However, actual communication distance is greatly dependent on the area of the antenna and the output capacity of the reader-writer.

The booster card 620 may be provided with a plurality of slots to receive a plurality of data carrier modules 610, and the data carrier module 610 inserted in each slot may communicate with an external reader-writer.

Figure 6B:
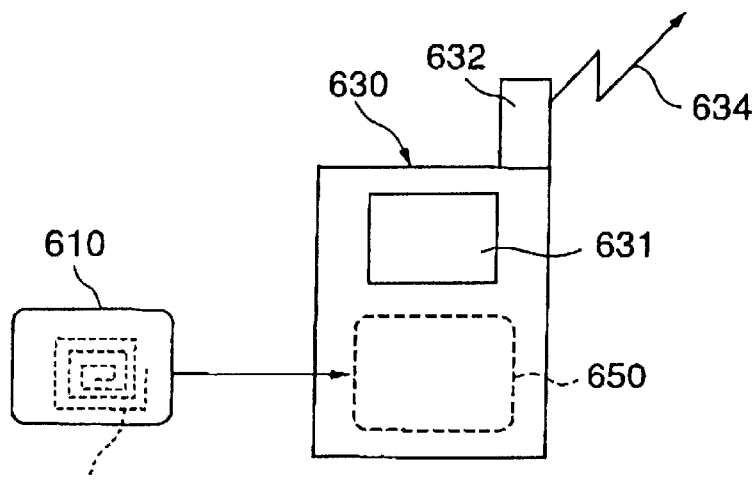

When using a data carrier module 610 having a coil (secondary coil) 611 as a SIM for a portable telephone 630 as shown in FIG. 6B, the data carrier module 610 is inserted in a slot 650 formed in the portable telephone 630.

The portable telephone 630 is provided with a booster antenna coil (primary coil), not shown having a densely coiled part formed in a part corresponding to the slot 650. The data carrier module 610 is inserted in the slot 650 so that the coil 611 overlies the densely coiled part of the booster antenna coil. The densely coiled part of the booster antenna coil and the coil 611 of the data carrier module 610 are formed in substantially the same shape to enhance electromagnetic coupling efficiency. Preferably, the booster antenna coil is formed in a part on the back side of the portable telephone 630.

When the data carrier module 610 is thus inserted in the slot 650 of the portable telephone 630, the contact/noncontact data carrier module 610 is able to exchange information with the portable telephone 630 through the booster antenna coil. The contact/noncontact data carrier module 610 can communicate through the portable telephone 630 with the Internet as shown in FIG. 6B or with a personal computer 640 as shown in FIG. 6C. Shown in FIGS. 6B and 6C are a display 631 included in the portable telephone 630, a communication antenna 632, an electromagnetic wave 634 emitted by the communication antenna 632, a display 641 included in the personal computer 640.

Preferably, the semiconductor chips of the contact/noncontact data carrier modules in the first to the fifth embodiment are provided with a user authentication circuit for authenticating the user, and a noncontact communication circuit for downloading various pieces of information through the Internet by a communication apparatus adapted to be connected to the Internet.

Figure 6C:
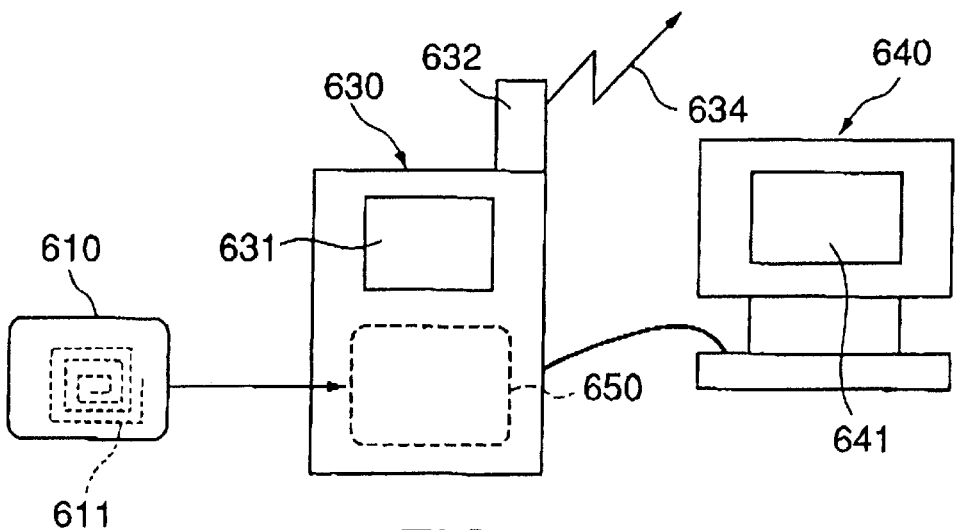

When the semiconductor chip of the contact/noncontact data carrier module 610 is provided with a user authentication circuit and a noncontact communication circuit, the user is able to download various pieces of information through the Internet and can be charged for the downloaded information by inserting the contact/noncontact type data carrier module 610 in the slot of the communication apparatus, such as a portable telephone 630 adapted to be connected to the Internet as shown in FIGS. 6B and 6C.

After writing information through the Internet to the contact/noncontact type data carrier module 610, (1) the contact/noncontact type data carrier module 610 can be used as a noncontact IC module for noncontact communication with an external reader-writer; (2) the contact/noncontact type data carrier module 610 can be used for noncontact communication through the antenna booster coil of the portable telephone 630 holding the contact/noncontact type data carrier module 610; and (3) the contact/noncontact type data carrier module 610 can exchange signals in a contact mode with a storage device, such as the storage device of the personal computer 640, through the portable telephone 630 holding the contact/noncontact type data carrier module 610.

What is claimed is:

1. A contact/noncontact data carrier module comprising:
   a base member;
   a semiconductor chip mounted on the base member, said semiconductor chip comprising a terminal surface with terminals thereon;
   a coil connected to the semiconductor chip adapted to be electromagnetically coupled with an external booster antenna for noncontact communication; and
   a contact terminal connected to the semiconductor chip and adapted to be brought into contact with an external contact, wherein
   the semiconductor chip is located on a first major surface of the base member such that said terminal surface provided with terminals faces away from said first major surface; the contact terminal is located on a second major surface on a side opposite the first major surface of the base member; the semiconductor chip and the contact terminals are connected through a hole located in the base member by a contact terminal connecting part; and the contact terminal connecting part comprising a bonding wire connecting a terminal of the semiconductor chip and the contact terminal.

2. The contact/noncontact data carrier module according to claim 1, wherein the coil is located on the terminal surface of the semiconductor chip; and the coil and the semiconductor chip are connected by a coil connecting part.

3. The contact/noncontact data carrier module according to claim 2, wherein the coil connecting part comprises a bonding wire connecting a terminal of the semiconductor chip and a terminal of the coil.

4. The contact/noncontact data carrier module according to claim 1, wherein the coil is located on the first major surface of the base member; and the semiconductor chip and the coil are connected by a coil connecting part.

5. The contact/noncontact data carrier module according to claim 4, wherein the coil connecting part comprises a bonding wire connecting a terminal of the semiconductor chip and a terminal of the coil.

6. The contact/noncontact data carrier module according to claim 4, wherein the coil is located near the semiconductor chip on the first major surface of the base member.

7. The contact/noncontact data carrier module according to claim 1, further comprising a sealing resin layer sealing the semiconductor chip, the coil and the wiring part therein.

8. The contact/noncontact data carrier module according to claim 1, is a SIM in combination with a booster card.

9. The contact/noncontact data carrier module according to claim 1, is a SIM in combination with a portable telephone.

10. The contact/noncontact data carrier module according to claim 1, wherein the semiconductor chip comprises a user authentication circuit for authenticating a user, and a noncontact communication circuit for downloading information from the Internet.

11. A contact/noncontact data carrier module comprising:
a base member;
a semiconductor chip mounted on the base member, said semiconductor chip comprising a terminal surface with terminals thereon;
a coil connected to the semiconductor chip and adapted to be electromagnetically coupled with an external booster antenna for noncontact communication; and
a contact terminal connected to the semiconductor chip and adapted to contact with an external contact, wherein
the semiconductor chip is located on a first major surface of the base member such that said terminal surface provided with terminals faces the base member; the contact terminal is located on a second major surface on an opposite side of the first major surface of the base member; and the semiconductor chip and the contact terminals are connected through a hole located in the base member by a contact terminal connecting part.

12. The contact/noncontact data carrier module according to claim 11, wherein the contact terminal connecting part comprises a connecting wiring part located on the first major surface of the base member, and a via part located in the hole and connecting the connecting wiring part and the contact terminal; and a terminal of the semiconductor chip is connected to the connecting wiring part by flip-chip solder bonding.

13. The contact/noncontact data carrier module according to claim 11, wherein the coil is located on the terminal surface of the semiconductor chip; and the coil and the semiconductor chip are connected by a coil connecting part.

14. The contact/noncontact data carrier module according to claim 13, wherein the coil is located on an insulting layer covering a wiring layer located on the terminal surface of the semiconductor chip; the wiring layer is connected to a terminal of the semiconductor chip; and the coil connecting part comprises the wiring layer, and a via part located in the insulating layer and connecting the wiring layer and the terminal of the coil.

15. The contact/noncontact data carrier module according to claim 11, wherein the coil is located on the first major surface of the base member; and the semiconductor chip and the coil are connected by a coil connecting part through a pair of coil connecting holes located in the base member.

16. The contact/noncontact data carrier module according to claim 15, wherein the coil connecting part comprises a connecting wiring part located on the second major surface of the base member, a connecting terminal located on the first major surface of the base member, and a pair of via parts respectively located in the pair of coil connecting holes of the base member and respectively connecting one terminal of the coil and the connecting wiring part, and the connecting wiring part and the connecting terminal; and terminals of the semiconductor chip are connected to the connecting terminal, connected to one terminal of the coil, and the other terminal of the coil by flip-chip solder bonding.

17. The contact/noncontact data carrier module according to claim 11, further comprising a sealing resin layer sealing the semiconductor ship, the coil and the wiring part therein.

18. The contact/noncontact data carrier module according to claim 11, wherein the data carrier module is a SIM in combination with a booster card.

19. The contact/noncontact data carrier module according to claim 11, wherein the data carrier module is a SIM in combination with a portable telephone.

20. The contact/noncontact data carrier module according to claim 11, wherein the semiconductor ship comprises a user authentication circuit for authenticating a user, and a noncontact type communication circuit for downloading information from the Internet.

21. A contact/noncontact data carrier module comprising:
a base member;
a semiconductor chip mounted on the base member, said semiconductor chip comprising a terminal surface with terminals thereon;
a coil connected to the semiconductor chip adapted to be electromagnetically coupled with an external booster antenna for noncontact communication; and
a contact terminal connected to the semiconductor chip and adapted to be brought into contact with an external contact, wherein
the semiconductor chip is located on a first major surface of the base member such that said terminal surface provided with terminals faces away from said first major surface; the contact terminal is located on a second major surface on a side opposite the first major surface of the base member; the semiconductor chip and the contact terminals are connected through a hole located in the base member by a contact terminal connecting part; and the contact terminal connecting part comprises a connecting wiring part located on the first major surface of the base member, a bonding wire connecting a terminal of the semiconductor chip and the connecting wiring part, and a via part formed in the hole of the base member and connecting the connecting wiring part and the contact terminal.

22. The contact/noncontact data carrier module according to claim 21, wherein the coil is located on the terminal surface of the semiconductor ship; and the coil and the semiconductor ship are connected by a coil connecting part.

23. The contact/noncontact data carrier module according to claim 22, wherein the coil connecting part comprises a bonding wire connecting a terminal of the semiconductor ship and a terminal of the coil.

24. The contact/noncontact data carrier module according to claim 21, wherein the coil is located on the first major surface of the base member; and the semiconductor ship and the coil are connected by a coil connecting part.

25. The contact/noncontact data carrier module according to claim 24, wherein the coil connecting part comprises a bonding wire connecting a terminal of the semiconductor ship and a terminal of the coil.

26. The contact/noncontact data carrier module according to claim 24, wherein the coil is located near the semiconductor ship on the first major surface of the base member.

27. The contact/noncontact data carrier module according to claim 24, wherein the coil is located on the terminal surface of the semiconductor ship; and the coil and the semiconductor ship are connected by a coil connecting part.

28. The contact/noncontact data carrier module according to claim 27, wherein the coil is located on an insulating layer covering a wiring layer formed on the terminal surface of the semiconductor chip; the wiring layer is connected to a terminal of the semiconductor ship; and the coil connecting part comprises the wiring layer, and a via part located in the insulating layer and connecting the wiring layer and the terminal of the coil.

29. The contact/noncontact data carrier module according to claim 21, further comprising a sealing resin layer sealing the semiconductor ship, the coil and the wiring part therein.

30. The contact/noncontact data carrier module according to claim 21 is a SIM in combination with a booster card.

31. The contact/noncontact data carrier module according to claim 21 is a SIM in combination with a portable telephone.

32. The contact/noncontact data carrier module according to claim 21, wherein the semiconductor ship comprises a user authentication circuit for authenticating the user, and a noncontact type communication circuit for downloading information from the Internet.

33. A contact/noncontact data carrier module comprising:
a base member;
a semiconductor ship mounted on the base member, said chip comprising a terminal surface with terminals thereon;
a coil connected to the semiconductor ship adapted to be electromagnetically coupled with an external booster antenna for noncontact communication; and
a contact terminal connected to the semiconductor ship and adapted to be brought into contact with an external contact,
wherein the semiconductor ship is located on a first major surface of the base member such that said terminal surface provided with terminals faces the base member; the contact terminal is located on a second major surface on a side opposite the first major surface of the base member; the semiconductor ship and the contact terminals are connected through a hole located in the base member by a contact terminal connected part; and the contact terminal connecting part comprises a connecting wiring part formed on the first major surface of the base member, and a via part located in the hole and connecting the connecting wiring part and the contact terminal; and a terminal of the semiconductor chip is connected to the connecting wiring part by flip-chip solder bonding.

34. The contact/noncontact data carrier module according to claim 33, wherein the coil is located on the first major surface of the base member; and the semiconductor chip and the coil are connected by a coil connecting part through a pair of coil connecting holes located in the base member.

35. The contact/noncontact data carrier module according to claim 34, wherein the coil connecting part comprises a connecting wiring part located on the second major surface of the base member, a connecting terminal located on the first major surface of the base member, and a pair of via parts respectively located in the pair of coil connecting holes of the base member and respectively connecting one terminal of the coil and the connecting wiring part, and the connecting wiring part and the connecting terminal; and terminals of the semiconductor ship are connected to the connecting terminal, connected to one terminal of the coil, and the other terminal of the coil by flip-chip solder bonding.

36. The contact/noncontact data carrier module according to claim 33, further comprising a sealing resin layer sealing the semiconductor chip, the coil and the wiring part therein.

37. The contact/noncontact data carrier module according to claim 33 is a SIM in combination with a booster card.

38. The contact/noncontact data carrier module according to claim 33 is a SIM in combination with a portable telephone.

39. The contact/noncontact data carrier module according to claim 33, wherein the semiconductor chip comprises a user authentication circuit for authenticating a user, and a noncontact type communication circuit for downloading information from the Internet.

* * * * *